United States Patent [19]
Landt

[11] Patent Number: 6,005,398
[45] Date of Patent: Dec. 21, 1999

[54] HIGH SPEED PHASE AND AMPLITUDE MEASUREMENT SYSTEM AND METHOD

[75] Inventor: Harvey L. Landt, Cedar Rapids, Iowa

[73] Assignee: Rockwell Science Center, Inc., Thousand Oaks, Calif.

[21] Appl. No.: 08/939,055

[22] Filed: Sep. 26, 1997

[51] Int. Cl.⁶ .................................................. G01R 27/28
[52] U.S. Cl. ...................... 324/650; 324/607; 324/76.77
[58] Field of Search ................................ 324/638, 650, 324/76.13, 76.15, 76.52, 76.58, 76.77, 76.78, 76.79, 605, 607; 333/17.3; 379/24; 702/78

[56] References Cited

U.S. PATENT DOCUMENTS

| | | | |
|---|---|---|---|
| 3,479,528 | 11/1969 | Fisher | 327/94 |
| 3,758,763 | 9/1973 | Nohara et al. | 324/76.47 |
| 4,150,310 | 4/1979 | Emile, Jr. | 327/33 |
| 4,151,473 | 4/1979 | Coleman et al. | 327/8 |
| 4,311,972 | 1/1982 | Landt et al. | 333/17.3 |
| 4,391,146 | 7/1983 | Grindheim | 324/675 |
| 4,506,209 | 3/1985 | Landt | 324/637 |
| 4,563,637 | 1/1986 | De Bortoli et al. | 324/76.17 |
| 4,575,867 | 3/1986 | Hogue | 377/110 |
| 4,751,468 | 6/1988 | Agoston | 327/10 |
| 4,862,016 | 8/1989 | Genrich | 327/94 |
| 4,935,692 | 6/1990 | Wakasugi | 324/607 |
| 5,036,219 | 7/1991 | Dingwall et al. | 327/92 |
| 5,404,388 | 4/1995 | Eu | 379/24 |
| 5,631,611 | 5/1997 | Luu | 333/17.3 |

*Primary Examiner*—Diep N. Do
*Attorney, Agent, or Firm*—Kyle Eppele; James P. O'Shaughnessy

[57] ABSTRACT

An impedance measurement system rapidly determines impedance of a sinusoidal signal at a known frequency. The sinusoidal signal can represent a forward voltage, a reflected voltage, a voltage, or a current on a transmission line. The impedance calculation is made by receiving two samples of a signal representing forward voltage and reflected voltage or two samples each of current and voltage. The samples are used to determine an amplitude value and a phase value for the signal. The amplitude and phase value are utilized to calculate the impedance.

20 Claims, 3 Drawing Sheets

HIGH SPEED PHASE AND AMPLITUDE MEASUREMENT SYSTEM AND METHOD

FIELD OF THE INVENTION

The present invention relates generally to a method and an apparatus for measuring phase and amplitude. More particularly, the present invention relates to a method and an apparatus for rapidly determining impedance measurements for high frequency (HF) circuits. Further still, the present invention relates to an impedance measurement system for HF antennae couplers and filters.

BACKGROUND OF THE INVENTION

Impedance measurement systems can be utilized in a variety of applications, including in a radio transceiver. For example, the impedance (e.g., the transmission line impedance) between an antennae (e.g., the load) and a transceiver (e.g., the power source) is often measured and adjusted to ensure maximum power transfer between the transceiver and the antennae, as is well known in the art. Maximum power transfer is ensured by making the transmission line impedance equal to the output impedance of the load. An example of a system that adjusts the impedance of the transmission line in a radio transceiver is disclosed in U.S. Pat. No. 4,311,972, entitled "High Speed Antennae Coupler." The coupler measures power transfer parameters at two different points along the transmission line and adjusts the impedance of the transmission line in accordance with the power transfer parameters.

The impedance of the transmission line and the antennae is not a constant impedance. Many variables can drastically affect the impedance of the transmission line and the load (e.g., particularly at high frequencies associated with radio transmissions). Examples of these variables are the frequency of the signal that is being applied to both the transmission line and the load, environmental conditions, weather conditions, manufacturing tolerance of the transmission line and the load, position of the antennae, altitude of the antennae, and combinations of the enumerated conditions. These enumerated conditions can drastically affect the operation of the transceiver and of the power transfer between the power source and the load which is normally an antennae.

Typically, a tunable impedance network between the power source and the load is adjusted so the output impedance of the power source matches the output impedance of the transmission line and the load. Conventionally, the load or the antennae has an impedance of 50 ohms under ideal conditions. The impedance network can be adjusted by a control circuit which determines a factor related to impedance based upon measured signals associated with the transmission line. For example, U.S. Pat. No. 4,506,209 discloses an impedance measurement system that utilizes a first discriminator which generates three analog signals that represent the reflected voltage, the forward voltages, and the phase difference between the reflected voltage and the forward voltage. The first discriminator receives an injection signal from a second discriminator. The injection signal has a frequency offset from the frequency of the power source. The analog signals are converted by a digital-to-analog converter and are provided to a computer to calculate the impedance between an antennae and a transceiver.

Heretofore, impedance measurement systems have been expensive, somewhat inaccurate, slow, and noisy. Some conventional systems require a large number of samples to accurately calculate impedance. These systems take longer to measure impedance. Others require significant circuitry to sense parameters from which the impedance is calculated. Still, other systems rely on time-consuming iterative techniques to determine impedance. Also, some conventional systems can cause noise to be injected or to be reflected back onto the transmission line.

Thus, there is a need for an impedance measurement system which is faster, more transparent, and less costly. Further still, there is a need for an impedance measurement system which can determine impedance within one cycle of a sinusoidal signal.

SUMMARY OF THE INVENTION

The present invention relates to an impedance measurement circuit for a radio frequency circuit. The radio frequency circuit includes a discriminator. The discriminator receives a radio frequency signal. The impedance measurement circuit includes a monitor circuit and a control circuit. The monitor circuit is coupled to the discriminator and generates a sinusoidal signal at a known frequency related to the radio frequency signal. The control circuit is coupled to the monitor circuit. The control circuit determines a phase value and an amplitude value for the sinusoidal signal. The control circuit takes samples of the sinusoidal signal at a sampling frequency. The amplitude value is calculated from two samples of the sinusoidal signal. The control circuit utilizes the amplitude value to determine an impedance value for the radio frequency circuit.

The present invention further relates to an impedance measurement circuit for a radio frequency circuit. The impedance measurement circuit includes a monitoring means and a control means. The monitoring means generates a first sinusoidal signal at a known frequency and a second sinusoidal signal at the known frequency. The monitoring means provides a plurality of first samples of the first sinusoidal signal and a plurality of second samples of the second sinusoidal signal at a sampling frequency. The control means determines a first phase value, a second phase value, a first amplitude value, and a second amplitude value. The control circuit calculates the first amplitude value and the first phase value from the first samples and the second amplitude value and the second phase value from the second samples. The control means utilizes the first phase value, the second phase value, the first amplitude value, and the second amplitude value to calculate an impedance value.

The present invention even further relates to a method of determining an impedance measurement for a radio frequency circuit. The radio frequency signal provides a radio frequency signal output. The method includes sampling a first sinusoidal measurement signal at a known frequency, whereby the sampling occurs at a sampling frequency at least four times the known frequency to obtain a first amplitude sample and a second amplitude sample. The method also includes sampling a second sinusoidal measurement signal at the known frequency, whereby the sampling occurs at the sampling frequency to obtain a third amplitude sample and a fourth amplitude sample. The method further includes calculating a first amplitude value and a first phase value from the first amplitude sample and the second amplitude sample, and calculating a second amplitude value and a second phase value from the third amplitude sample and the fourth amplitude sample. The method additionally includes calculating the impedance measurement from the first amplitude value, the first phase value, the second amplitude value, and the second phase value.

In one aspect of the present invention, a digital impedance measurement circuit determines a current amplitude value, a current phase value, a voltage amplitude value, and a voltage phase value of a sinusoidal signal at a known frequency associated with a radio frequency signal. The system samples current and voltage amplitude at a frequency four times the known frequency to simplify the calculation of the current amplitude, the voltage amplitude, and the phase difference between the current and voltage. The impedance is calculated from the current amplitude value, voltage amplitude value, current phase value, and voltage phase value.

In accordance with another exemplary embodiment of the present invention, the impedance measurement system samples sinusoidal signals at known frequencies related to a forward voltage signal and a reflected voltage signal. The system samples at a frequency four times the known frequency of the sinusoidal signal. The forward voltage signal and the reflected voltage signal are utilized to calculate the impedance.

According to another aspect of the present invention, an antennae coupler or filter includes a control circuit which measures the impedance and adjusts an impedance network. The control circuit measures the impedance in a rapid manner, utilizing two samples of two characteristics of a sinusoidal signal related to the radio frequency (RF) signal. The characteristics can be voltage and current or forward voltage and reflected voltage. The control circuit can be implemented with an analog-to-digital converter and a microprocessor. The system can be utilized to accurately tune an antennae coupler or other filter and provides sophisticated built-in test measurements for the antennae coupler or filter.

BRIEF DESCRIPTION OF THE DRAWINGS

The invention will be further described with reference to the accompanying drawings, wherein like numerals denote like elements, and.

DETAILED DESCRIPTION OF THE PREFERRED EMBODIMENTS

Figure 1:
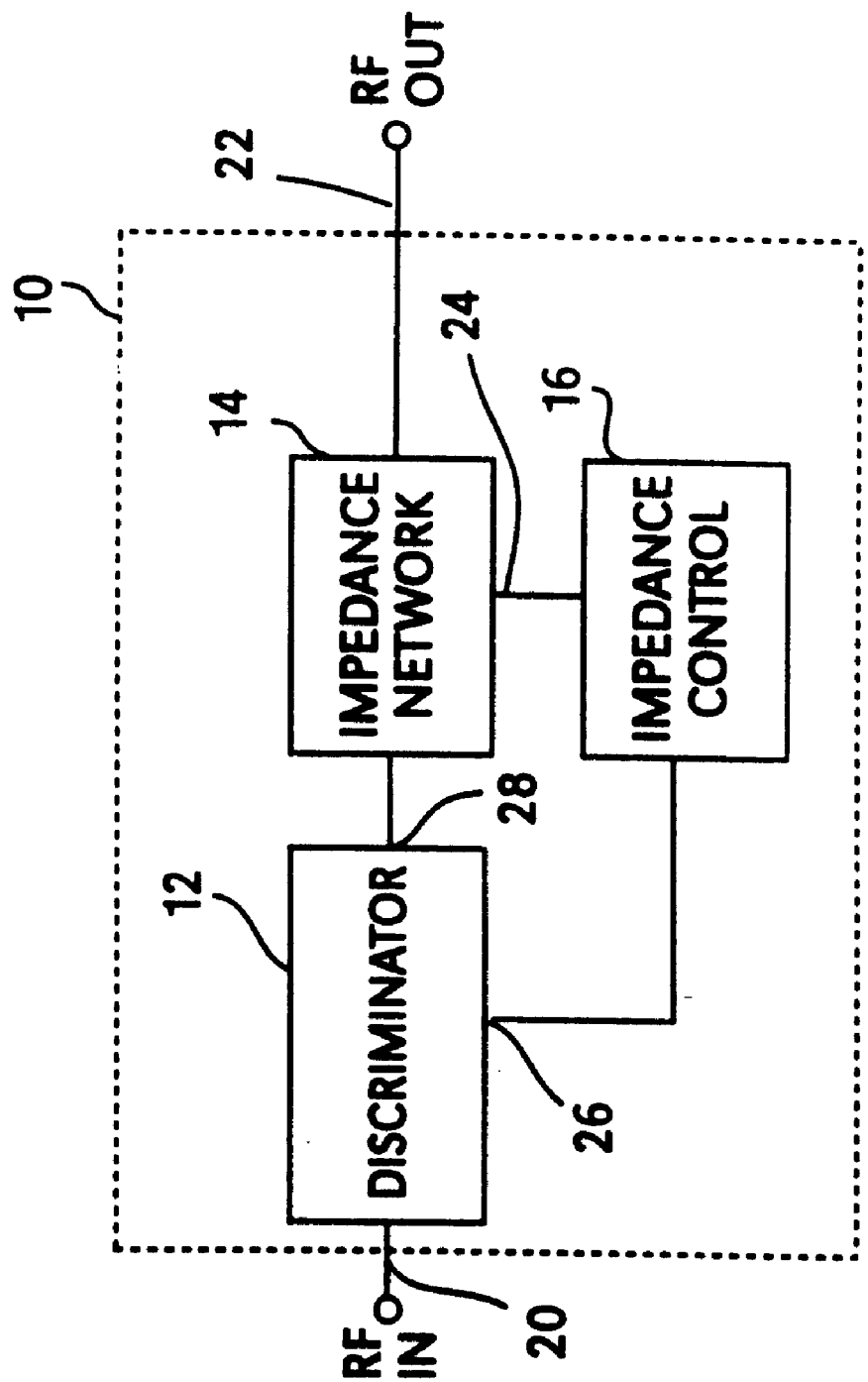
FIG. 1 is a schematic block diagram of a radio frequency circuit that includes a discriminator having an impedance measurement system in accordance with an exemplary embodiment of the present invention.

With reference to FIG. 1, a radio frequency circuit 10 can be an antennae coupler, a filter, or other high frequency device. Circuit 10 is preferably involved in the transmission or reception of radio frequency (RF) signals. The RF signal can be in the ultra-high frequency (UHF) range, very-high frequency (VHF) range or other frequency range. The RF signal is preferably between 2 and 30 MHz.

Circuit 10 includes a discriminator 12, an impedance control circuit 16, and an impedance network 14. Discriminator 12 has an input coupled to a RF input 20 of circuit 10, an impedance measurement output 26 coupled to control circuit 16 and a signal output 28 coupled to impedance network 14. Impedance network 14 is also coupled to RF output 22 and has a control input 24 coupled to control circuit 16.

Discriminator 12 preferably includes circuitry (not shown in FIG. 1) which converts signals derived from the RF signal to a sinusoidal signal. For example, discriminator 12 can convert measurement signals related to the RF signal to the sinusoidal signal at the known frequency. The sinusoidal signal is preferably at a lower frequency so that it can be adequately handled by digital components, such as, sampling digital-to-analog converters. The sinusoidal signal is preferably a 25 KHz signal. Alternatively, intermediate frequency (IF) signals at a known frequency can be utilized. The IF signals can be derived from other parts of circuit 10.

Impedance network 14 has a variable or adjustable impedance. The impedance changes in response to a control signal provided from control circuit 16 at input 24. Control circuit 16 preferably controls the impedance of network 14 in response to an impedance measurement signal from output 26 of discriminator 12. Circuit 16 responds to the impedance measurement signal and causes an antenna (not shown) and circuit 10 to have an impedance which matches the output impedance of an amplifier (not shown) coupled to RF input 20 (e.g., approximately 50 ohms).

Discriminator 12 can very accurately and very quickly determine the impedance measurement signal for circuit 10. Discriminator 12 obtains parameter values associated with the sinusoidal signal developed from the RF signal and digitally determines the impedance associated with the antennae and circuit 10. Discriminator 12 generates the impedance measurement signal at output 26. Discriminator 12 can be utilized to constantly monitor and test circuit 10. For example, circuit 10 can be adjusted when channel selection changes affect the impedance of circuit 10.

Figure 2:
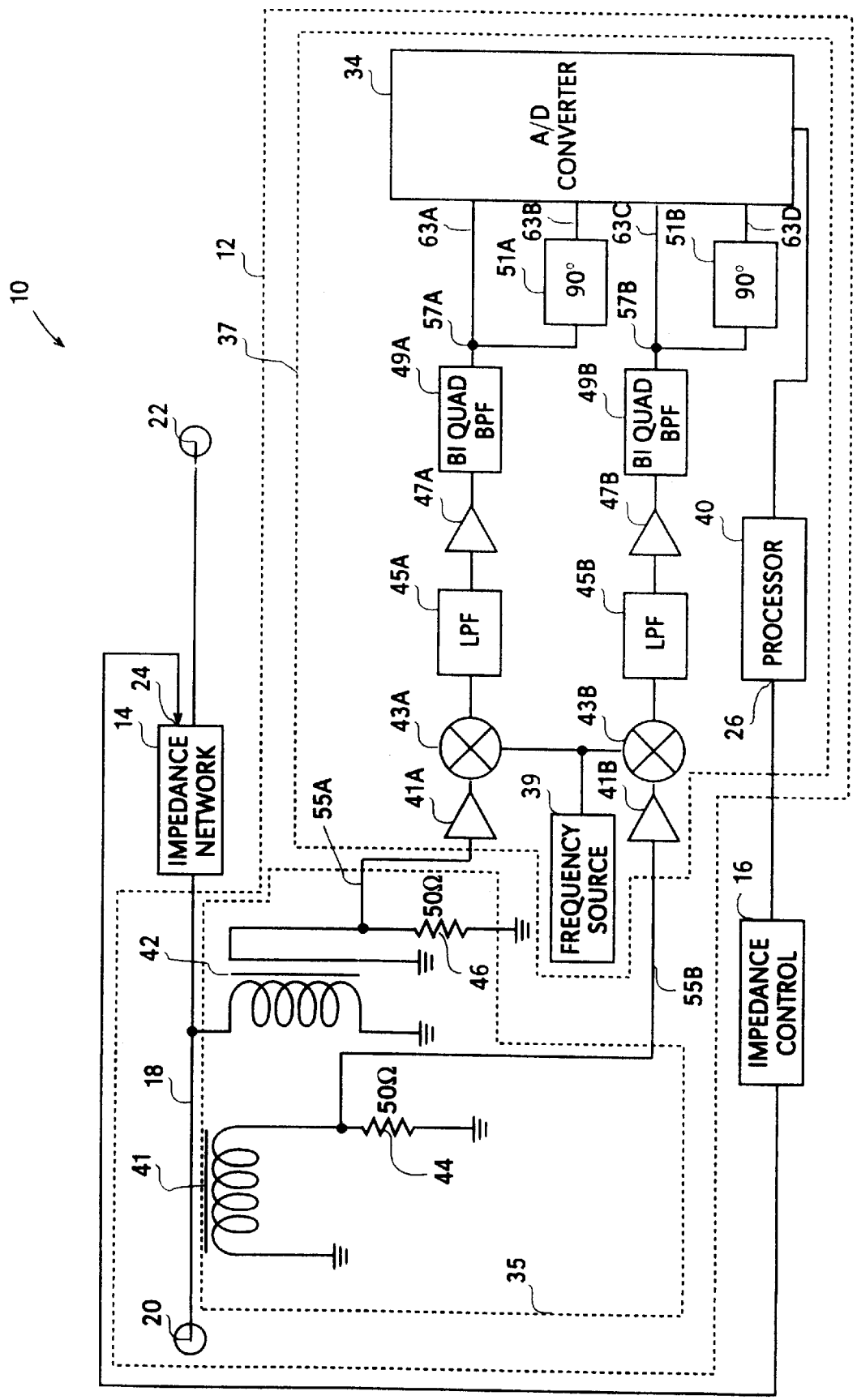
FIG. 2 is a more detailed block diagram of the impedance measurement system illustrated in FIG. 1, wherein the system utilizes current and voltage signals in accordance with another exemplary embodiment of the present invention.

With reference to FIG. 2, circuit 10 includes a transmission line 18 coupled between RF input 20 and RF output 22. Discriminator 12 includes a monitor circuit 35 and a control circuit 37. Control circuit 37 includes a frequency source 39, a pair of buffers 41A and B, a pair of mixers 43A and B, a pair of low pass filters 45A and B, a pair of buffers 47A and B, a pair of biquad band pass filters 49A and B, a pair of 90° phase delay circuits 51A and B, an analog-to-digital converter 34, and a microcontroller or microprocessor 40. Monitoring circuit 35 of discriminator 12 is electromagnetically coupled to transmission line 18 via a current transformer 41 and a voltage transformer 42.

Current transformer 41 is preferably a core transformer having 32 turns disposed around line 18. Voltage transformer 42 is also a core transformer having 32 turns coupled directly to line 18 (e.g., preferably at an end of line 18). Current transformer 41 provides a current signal representative of the current associated with line 18 through a 50 ohm resistor 44. Resistor 44 provides a voltage signal (the current parameter signal) representative of the current at an output 55B. Similarly, transformer 42 provides a voltage signal (the voltage parameter signal) representative of the voltage of the signal at line 18 across a 50 ohm resistor 46 to provide a voltage signal at output 55A. Alternatively, circuit 35 can utilize other monitoring devices to obtain voltage and current parameter signals.

Control circuit 37 receives the voltage parameter signal at output 55A and the current parameter signal at output 55B at buffers 41A and 41B, respectively. The voltage and current parameter signals have the frequency of the RF signal on line 18. The voltage and current parameter signals are converted by mixers 43A and 43B, respectively, to a known frequency, such as, 25 KHz, sinusoidal signal. Filters 45A and 45B provide the converted voltage and current parameter signals through buffers 47A and 47B, to filters 49A and 49B, and then to nodes 57A and 57B.

At node 57A, the converted voltage parameter signal is received by a first input 63A of analog-to-digital converter 34 and by 90° phase delay circuit 51A. Circuit 51A provides the converted delayed voltage parameter signal to a second input 63B of converter 34. Similarly, at node 57B the converted current parameter signal is received by a third input 63C of converter 34, and by 90° phase delay circuit 51B. Circuit 51B provides the converted current parameter signal to a fourth input 63D of converter 34.

Converter 34 provides digital representations of the signals at inputs 63A–D across a data buss to processor 40. Therefore, converter 34 provides two digital samples of the magnitude of the converted voltage and current parameter signals. The samples of each are 90° apart in phase. Circuits 51A and 51B are configured to provide the 90° phase delay for the sinusoidal signal at the known frequency.

Alternatively, analog-to-digital converter 34 could sample two consecutive signals of the converted current and voltage signals at a time period representative of a 90° phase delay, such as, at a sampling rate of four times the known frequency. The use of a four-input analog-to-digital converter 34 allows simultaneous determination of the two parameter values for both the current and the voltage used in the calculation of the impedance value by processor 40. In another alternative, a first in/first out (FIFO) memory can be coupled to converter 34 to buffer or to store parameter values for microprocessor 40.

Frequency source 39 can be a divider, a direct digital synthesizer, or a frequency source which provides variable frequencies to mixers 43A and 43B so that mixers 43A and 43B generate the sinusoidal signals of the converted voltage as current parameter signals at the known frequency. Frequency source 39 may receive frequency information from a channel selector or other device associated with circuit 10, so the appropriate conversion of the voltage and current signals at output 55A and 55B is made.

The calculation of impedance based upon the two samples of the converted voltage parameter signal and the two samples of the converted current parameter signal is discussed below as follows. The impedance magnitude (Z) equals the magnitude of the voltage signal ($E_m$) over the magnitude of the current signal ($I_m$). The phase delay ($\Theta_z$) is determined by subtracting the phase delay of the current signal ($\Theta_i$) from the phase delay of the voltage signal ($\Theta_v$).

$$(Z=E_m/I_m \text{ and } \Theta_z=\Theta_v-\Phi_i).$$

Microprocessor 40 determines the magnitude of the voltage parameter signal and the current parameter signal according to the following equations. Microprocessor 40 receives two samples of the magnitude of the converted voltage signals ($E_1$ and $E_2$) and two samples of the magnitudes of the converted current signals ($I_1$ and $I_2$) from converter 34. If converter 34 samples at four times the known frequency of the converted voltage and current parameter signals or delay circuits 57A and 57B are used (see FIG. 2), $E_1$ and $E_2$ and $I_1$ and $I_2$ are separated by a 90° phase angle from each other. Accordingly:

$$\Theta_2=\Theta_1+90 \text{ and } \Phi_2=\Phi_1+90$$

For sinusoidal signals:

$$E_1=E_m \sin \Theta_1, \text{ and } I_1=I_m \sin \Phi_1$$
$$E_2=E_m \sin \Theta_2, \text{ and } I_2=E_m \sin \Phi_2$$

where
  $\Theta_1$ is the phase delay of the voltage signal $E_1$;
  $\Theta_2$ is the phase delay of the voltage signal $E_2$; $\phi_1$ is the phase delay of the current signal $I_1$; and
  $\Phi_2$ is the phase delay of the current signal $I_2$.
Therefore: $E_m=\text{SQRT}(E_1^2+E_2^2)$ and $I_m=\text{SQRT}(I_1^2+I_2^2)$ because: $\sin \Theta_2=\cos \Theta_1$ and $E_1^2+E_2^2=E_m^2 \cos^2\Theta_1+E_m^2 \sin^2\Theta_1$ and $\sin\Phi_2=\cos\Phi_1$; and
  $I_1^2+I_2^2=I_m^2\sin^2\Phi_1+I_m^2\cos^2\Phi_1$
Therefore: $\Theta_1=\text{ARC SIN ABS}(E_1/E_m)$ and $\Phi_1=\text{ARC SIN ABS}(I_1/I_m)$.

A determination of $\Theta_V$ is calculated as follows:
  For $E_1 \geq 0$ and $E_2 \geq 0$, then $\Theta_V=\Theta_1=\text{ARC SIN ABS}(E_1/E_m)$;
  For $E_1 \geq 0$ and $E_2<0$, then $\Theta_V=180°-\Theta_1$;
  For $E_1<0$ and $E_2<0$, then $\Theta_V=180°+\Theta_1$;
  For $E_1<0$ and $E_2>0$, then $\Theta_V=360°-\Theta_1$.
A determination of $\Theta_i$ is calculated as follows:
  For $I_1 \geq 0$ and $I_2 \geq 0$, then $\Phi_i=\Phi_1=\text{ARC SIN ABS}(I_1/I_m)$;
  For $I_1 \geq 0$ and $I_2<0$, then $\Phi_i=180°-\Phi_1$;
  For $I_1<0$ and $I_2<0$, then $\Phi_i=180°+\Phi_1$;
  For $I_1<0$ and $I_2>0$, then $\Phi_i=360°-\Phi_1$.
Thus, the amplitude and phase of the current and voltage parameter signals can be completely determined based upon two samples of the parameter signals in less than one quarter cycle of the signals. If the known frequency is a 25 KHz cycle, the sampling of the signals can be made in 10 microseconds. An additional advantage of the present apparatus is that a phase relationship does not need to be maintained between the signals and the sampler.

Figure 3:
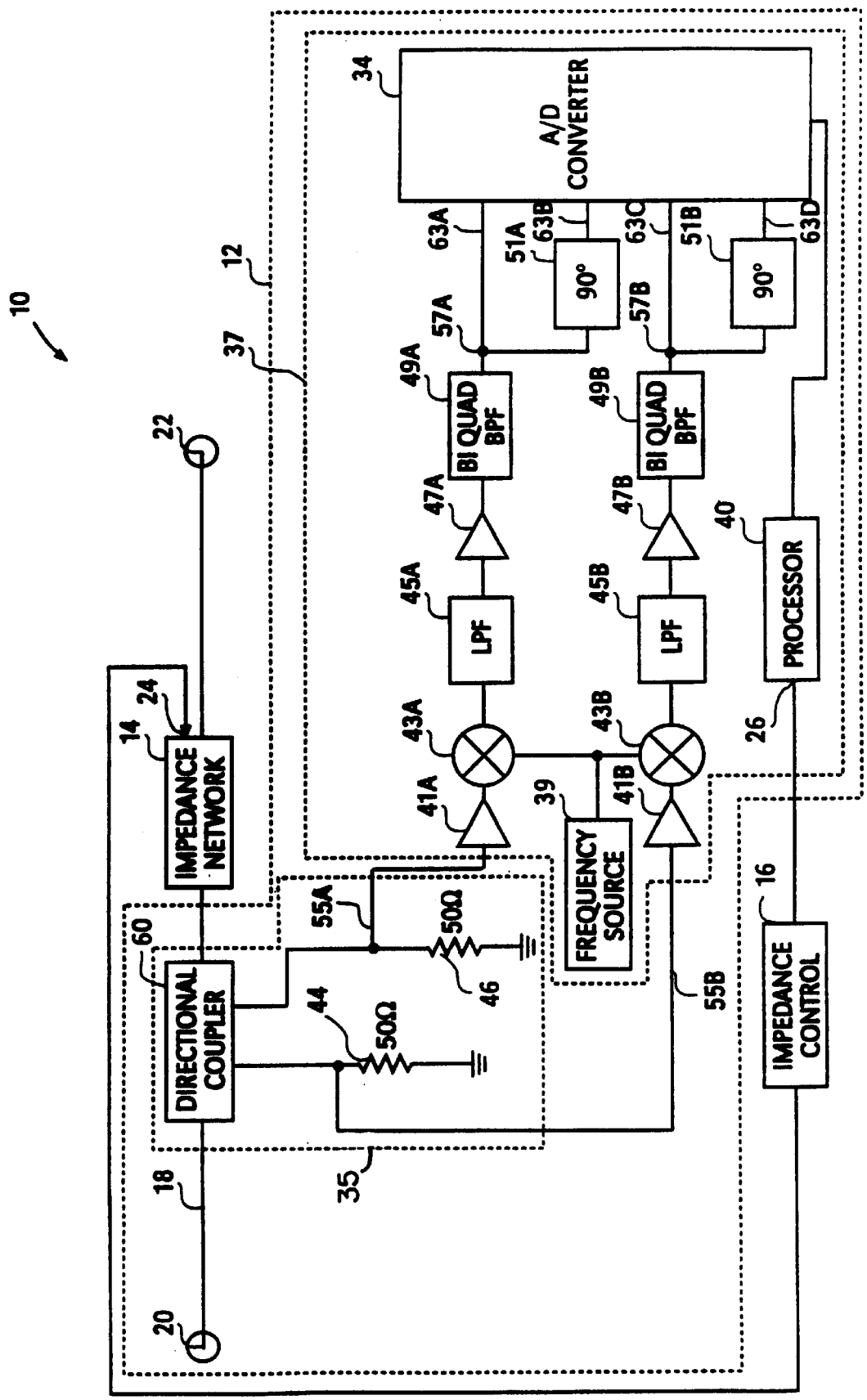
FIG. 3 is a block diagram of the impedance measurement system illustrated in FIG. 1, wherein the system utilizes forward and reflected voltages in accordance with a further exemplary embodiment of the present invention.

In accordance with another embodiment of the present invention, the impedance can be determined by utilizing a forward voltage measurement and a reflected voltage measurement. With reference to FIG. 3, circuit 10 is similar to circuit 10 illustrated in FIG. 2. However, monitoring circuit 35 includes a directional coupler 60 coupled to line 18. Directional coupler 60 provides a forward voltage signal at output 55A and a reflected voltage signal at output 55B. Control circuit 37 operates substantially similar to control circuit 37 illustrated in FIG. 2. However, the calculation of impedance is slightly different.

The magnitude of the forward voltage EF and the magnitude of the reverse voltage ER is calculated similarly to the magnitude of the voltage signal Em discussed with reference to FIG. 2. Similarly, the phase difference ($\Theta_c=\Theta_F-\Theta_R$) between the forward voltage signal and the reflected voltage signal can be calculated similarly to the calculation of the phase difference ($\Theta_z$) between the voltage signal and current signal discussed with reference to FIG. 2. The impedance Z is equal:

$$Z=Z_V(1+\rho)/(1-\rho);$$

where $$\text{ABS}(\rho) = \frac{\text{ABS}(E_R)}{\text{ABS}(E_F)};$$

therefore $\rho=\text{ABS}(\rho)<\Theta_c$; and
  $Z_v$=the characteristic impedance of transmission line 18.
Thus, circuit 37 can utilize forward voltage and reflected voltage signals to calculate the impedance value for circuit 10.

Alternatively, converter 34 in FIGS. 2 and 3 can be replaced with a single input analog-to-digital converter and a multiplexer. The multiplexer would receive the signals from mixers 43A and 43B and alternatively provide samples to converter 34. In such an embodiment, phase delay circuits 51A and 51B are not utilized, and subsequent sampling after a time delay equivalent to a 90° phase delay would be necessary. Alternatively, sample-and-hold circuits (not shown) can be used with phase delay circuits 51A and 51B to provide samples of delayed signals.

It will be understood that while the various conductors/connectors may be depicted in the drawings of similar lines, they are not shown in the limiting sense as understood in the art. Further, the above description is a preferred example embodiments of the present exemption, and the invention is not limited to the specific forms shown. For example, while various sampling circuits have been described, any type of sampling circuit can be utilized. Further still, although particular radio frequency circuits are discussed, any circuit utilizing high frequency signals where impedance measurement is necessary can utilize the present invention. These and other modifications may be made in the design or arrangements of the elements discussed here and without departing from the scope of the invention as expressed in the appended claims.

I claim:

1. An impedance measurement circuit for a radio frequency circuit, the radio frequency circuit including a discriminator, the discriminator receiving a radio frequency signal, the impedance measurement circuit comprising:
   a monitor circuit within the discriminator, the monitor circuit deriving a derived signal from the radio frequency signal; and
   a control circuit coupled to the monitor circuit, the control circuit generating a sinusoidal signal at a known frequency from the derived signal, the sinusoidal signal having an amplitude and a phase related to the radio frequency signal, and determining a phase value related to the phase and an amplitude value related to the amplitude, the control circuit taking samples of the sinusoidal signal at a sampling frequency, the amplitude value being calculated from two samples of the sinusoidal signal, the control circuit utilizing the amplitude value to determine an impedance value for the radio frequency circuit.

2. The impedance measurement circuit of claim 1, wherein the sampling frequency is four times the known frequency.

3. The impedance measurement circuit of claim 2, wherein the amplitude value is equal to a square root of a first squared magnitude of a first sample plus a second squared magnitude of a second sample.

4. The impedance measurement circuit of claim 1, wherein the two samples includes a 90 phase delayed sample.

5. The antennal coupler of claim 4 wherein the control circuit includes a converter and a microprocessor for calculating the phase value and the amplitude value.

6. The impedance measurement circuit of claim 1, wherein the amplitude value is determined from samples of a forward value of the sinusoidal signal and a reflected value of the sinusoidal signal.

7. The impedance measurement circuit of claim 6, wherein the control circuit includes a multiplexer for receiving the forward value and the reflected value.

8. An impedance measurement circuit for a radio frequency circuit, the radio frequency circuit processing a high frequency signal, the impedance measurement circuit comprising:

a monitor means for providing a first derived signal and a second derived signal related to the high frequency signal; and
   a control means for providing a first sinusoidal signal related to the first derived signal at a known frequency and a second sinusoidal signal related to the second derived signal at the known frequency, the first sinusoidal signal having a first amplitude and a first phase, the second sinusoidal equal having a second amplitude and second phase, the control means determining a first phase value of the first phase, a second phase value of the second phase, a first amplitude value of the first amplitude and a second amplitude value of the second amplitude, the control circuit calculating the first amplitude value and the first phase value from the first samples and the second amplitude value and the second phase value from the second samples, the control means utilizing the first phase value, the second phase value, the first amplitude value and the second amplitude value to calculate an impedance value.

9. The impedance measurement circuit of claim 8, wherein the sampling frequency is four times the known frequency.

10. The impedance measurement circuit of claim 8, wherein the monitor means includes a directional coupler and the first sample is a forward voltage and the second sample is a reflected voltage.

11. The impedance measurement circuit of claim 8, wherein the monitor means includes a current transformer and the first sample is a current signal and the second sample is a voltage signal.

12. The impedance measurement circuit of claim 8, wherein the first amplitude value is determined as a square root of a sum of two squared first sample values.

13. The impedance measurement circuit of claim 12, wherein the first phase value is determined as a constant plus or minus an inverse sinusoidal function of a first sample value divided by the amplitude value.

14. The impedance measurement circuit of claim 13, wherein the constant is 0° when the first sample value is greater than or equal to zero and the second sample value is greater than or equal to zero, the constant is 180° when the first sample value is greater than or equal to zero and the second sample value is less than zero, the constant is 180° when the first sample value is less than zero and the second sample value is less than or equal to zero, the constant is 360° when the first sample value is less than zero and the second sample value is greater than or equal to zero.

15. A method of determining an impedance measurement for a radio frequency circuit, the radio frequency circuit provides a radio frequency signal, the method comprising:
   sampling a first sinusoidal measurement signal, the first sinusoidal measurement signal being at a known frequency and having a first amplitude and a first phase related to the radio frequency signal, the sampling occurring at a sampling frequency at least four times the known frequency to obtain a first amplitude sample and a second amplitude sample;
   sampling a second sinusoidal measurement signal, the second sinusoidal measurement signal being at the known frequency and having a second amplitude and a second phase related to the radio frequency signal, the sampling occurring at the sampling frequency to obtain a third amplitude sample and a fourth amplitude sample;
   calculating a first amplitude value from the first amplitude sample and the second amplitude sample;

calculating a first phase value from the first amplitude sample and the second amplitude sample;

calculating a second amplitude value from the third amplitude sample and the fourth amplitude sample;

calculating a second phase value from the third amplitude sample and the fourth amplitude sample; and calculating the impedance measurement from the first amplitude value, first phase value, second amplitude value and second phase value.

16. The method of claim 15, wherein the first measurement signal is a current signal and the second measurement signal is a voltage signal.

17. The method of claim 15, wherein the first measurement signal is a forward signal and the second measurement signal is a reflected signal.

18. The method of claim 15, wherein the sampling steps are performed with an analog-to-digital converter.

19. The method of claim 18, wherein the sampling steps are performed with a multiplexer.

20. The method of claim 15, wherein the impedance measurement is used to tune an impedance network.

* * * * *